United States Patent [19]
Bressner

[11] Patent Number: 6,056,499
[45] Date of Patent: May 2, 2000

[54] LIFTING DEVICE AND END EFFECTOR FOR HOLDING A CIRCUIT BOARD TEST FIXTURE

[75] Inventor: Eric B. Bressner, Winston, Ga.

[73] Assignee: Alum-a-Lift, Inc., Winston, Ga.

[21] Appl. No.: 08/992,300

[22] Filed: Dec. 17, 1997

[51] Int. Cl.[7] ....................................................... B66F 9/18
[52] U.S. Cl. ............................ 414/621; 414/618; 414/620
[58] Field of Search ..................................... 414/618, 620, 414/621, 225.01, 277, 281; 294/67.33, 119.1, 907; 901/46, 49, 39

[56] References Cited

U.S. PATENT DOCUMENTS

| | | | |
|---|---|---|---|
| 1,824,339 | 9/1931 | Foradas et al. ........................... | 414/620 |
| 2,983,391 | 5/1961 | Insolio et al. ............................ | 212/334 |
| 3,623,620 | 11/1971 | Vermette ................................. | 414/620 |
| 3,704,799 | 12/1972 | Morris, Jr. . | |
| 3,734,304 | 5/1973 | Cabaniss . | |
| 3,951,286 | 4/1976 | Horst . | |
| 4,652,204 | 3/1987 | Arnett . | |
| 4,714,399 | 12/1987 | Olson ........................................ | 901/46 |
| 4,744,709 | 5/1988 | Hertel et al. .............................. | 901/46 |
| 4,797,564 | 1/1989 | Ramunas .................................... | 901/46 |
| 4,854,422 | 8/1989 | Kawada et al. . | |
| 4,954,005 | 9/1990 | Knasel et al. ............................. | 901/49 |
| 4,961,682 | 10/1990 | Nilsson ................................... | 414/620 |
| 5,195,762 | 3/1993 | Pressly . | |
| 5,224,808 | 7/1993 | Macris . | |
| 5,299,659 | 4/1994 | Imbeault et al. . | |
| 5,413,454 | 5/1995 | Movsesian . | |
| 5,823,737 | 10/1998 | Cook ...................................... | 414/621 |

*Primary Examiner*—Steven A. Bratlie
*Attorney, Agent, or Firm*—Jones & Askew, LLP

[57] ABSTRACT

An end effector assembly is provided which allows for transport of test fixtures between storage locations and testing locations. The end effector assembly includes a pivotable frame, a pair of loading arms which can be separated or drawn together, and a pair of gripping members which provide a wristlike action. Operation of the apparatus is provided by manipulating the apparatus into the vicinity of a first location, manipulating the elongate arms such that they engage the opposing handles, lifting the test fixture from a first position, manipulating the apparatus into the vicinity of a second location; and lowering the test fixture into the second position.

10 Claims, 13 Drawing Sheets

FRONT VIEW

FRONT ELEVATIONAL VIEW

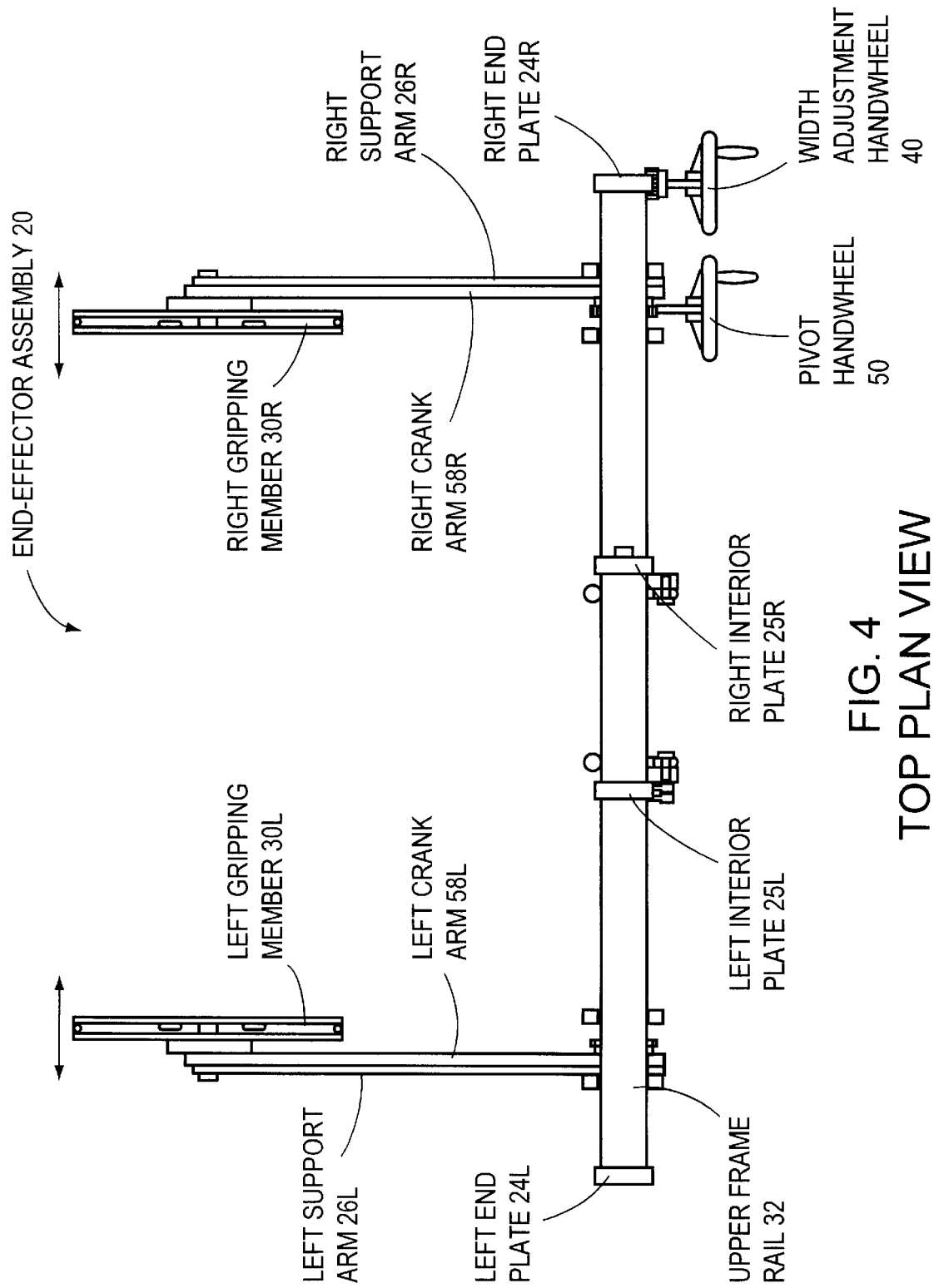

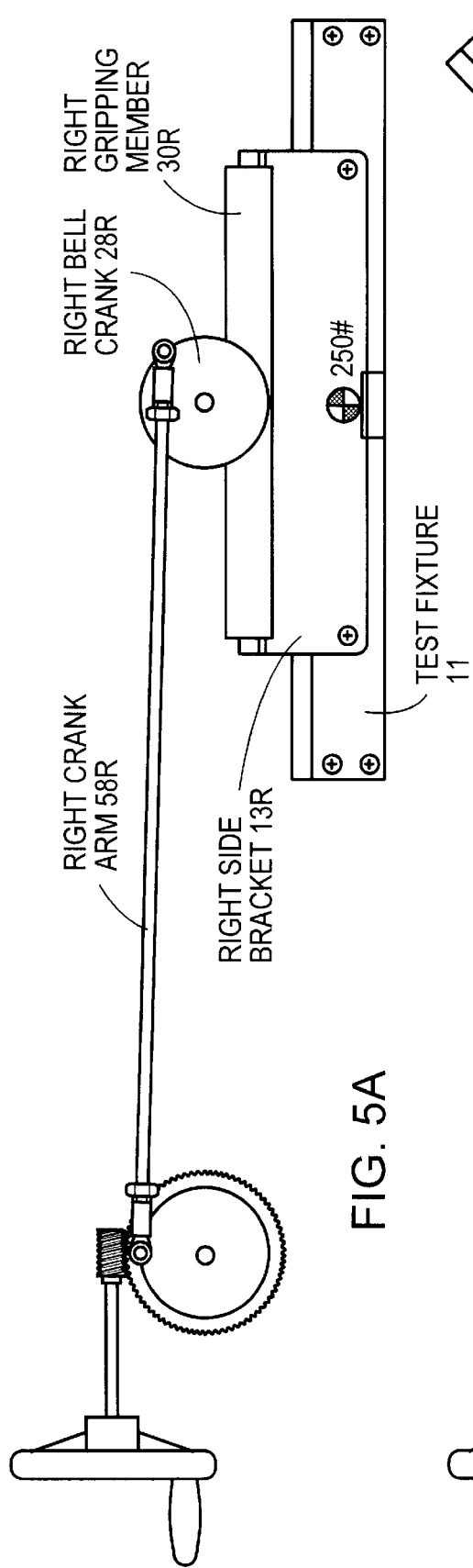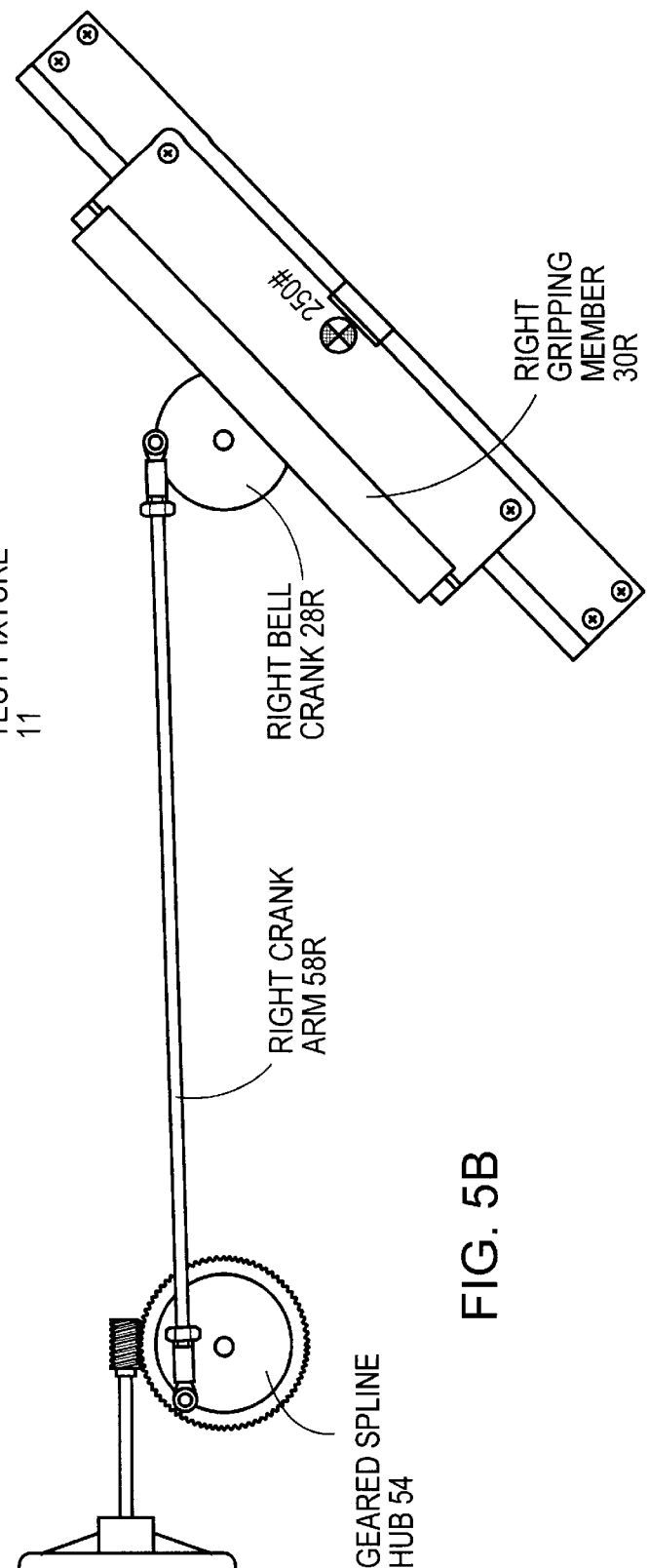
FIG. 5A
FIG. 5B

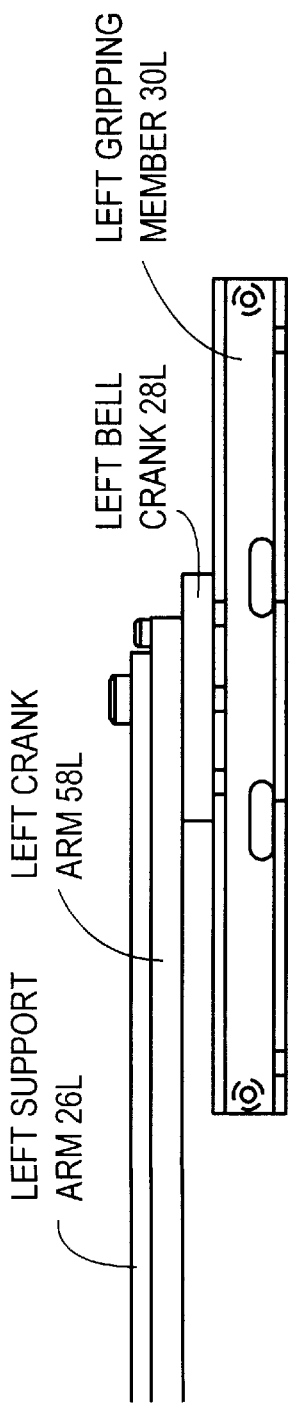
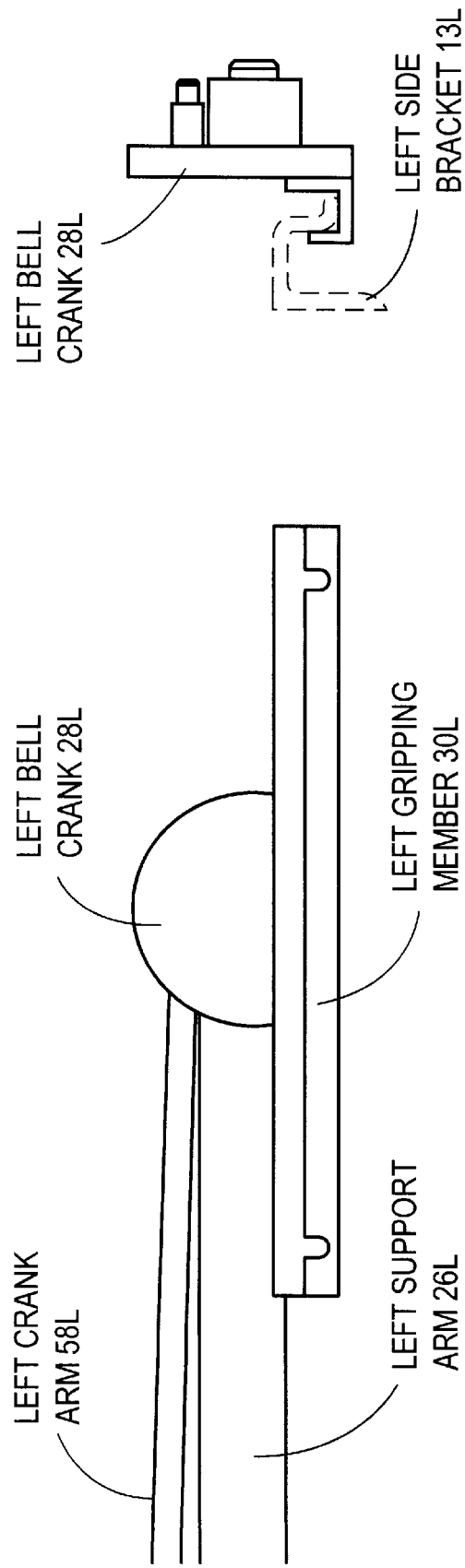

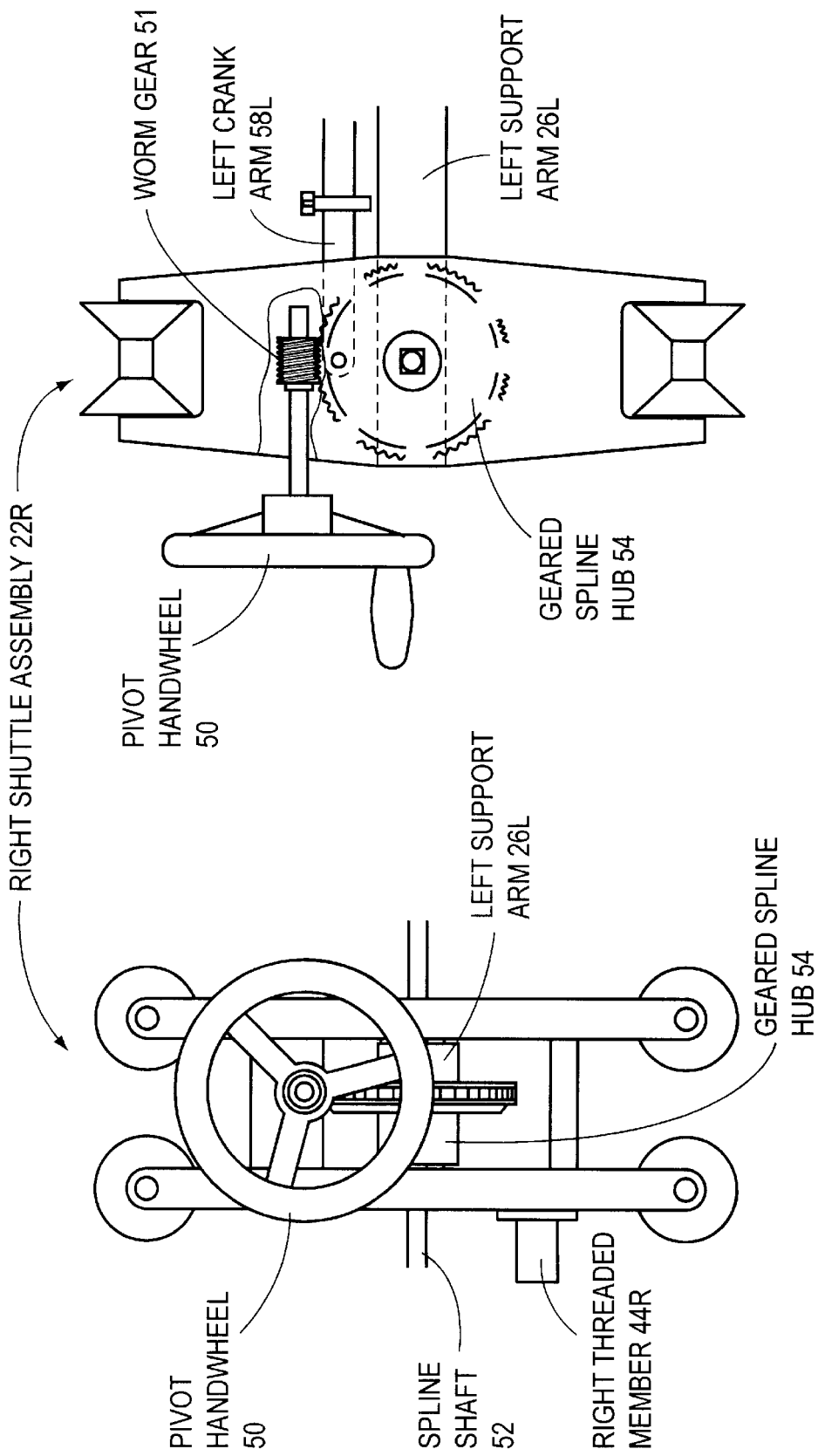

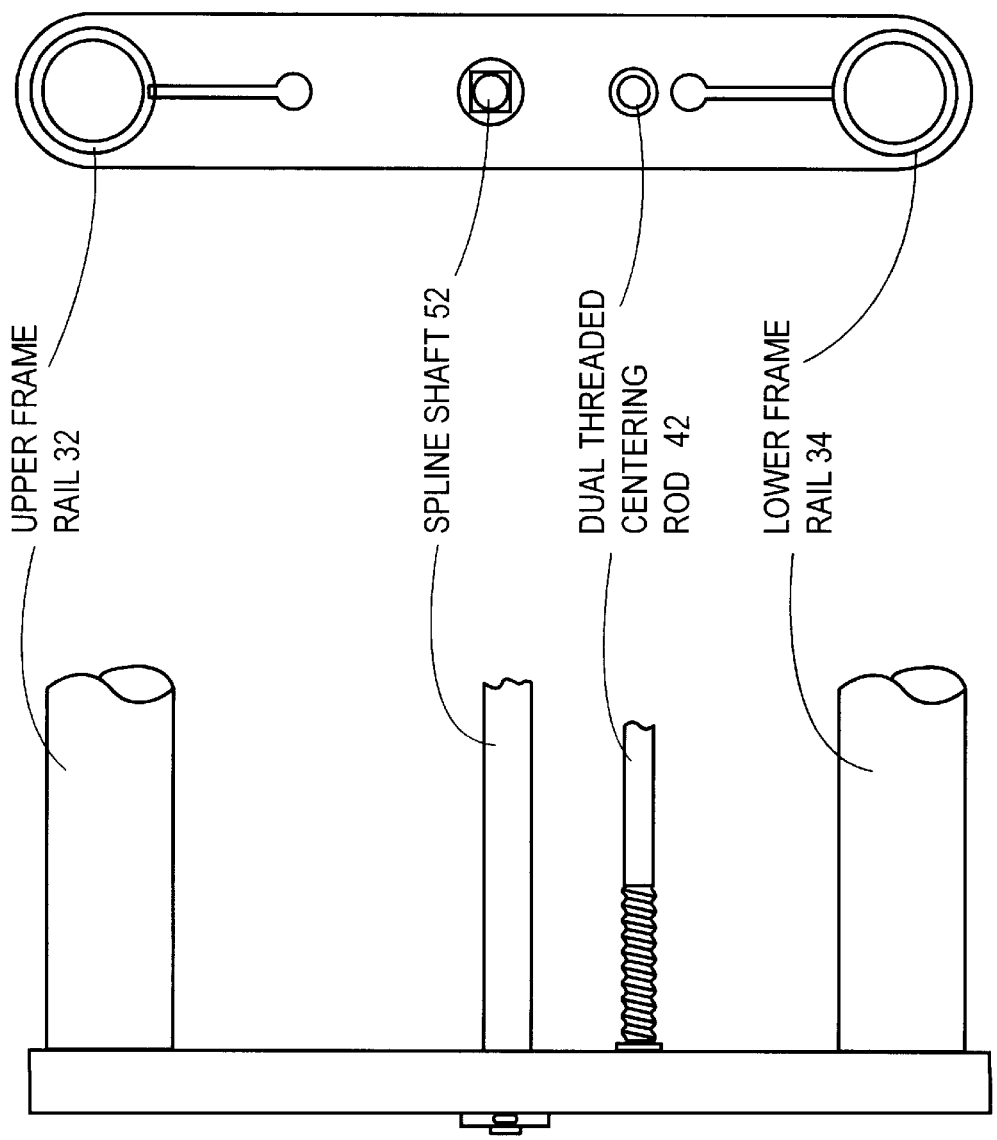

LIFTING DEVICE AND END EFFECTOR FOR HOLDING A CIRCUIT BOARD TEST FIXTURE

TECHNICAL FIELD

This invention relates in general to lifting devices, and particularly relates to an apparatus (and method of using same) for moving a test fixture for use in testing circuit boards and the like back and forth between a storage location and a location atop a circuit board testing console. The lifting devices require a minimum of physical effort and accommodate a wide variety of test fixture and testing console configurations.

BACKGROUND OF THE INVENTION

The use of electrical circuit boards has become commonplace in recent decades. Such printed circuit boards typically are generally planar in shape and include a plurality of electrical connections and components, and can be used for a multitude of purposes.

As may be understood, there is often a need to test such circuit boards. Such testing can be done with the use of circuit board testing apparatuses which test the electrical integrity of printed circuit boards under test (BUTs). As each BUT has a plurality of downwardly directed accessible nodes, the testing apparatuses typically include support means for removably supporting the BUTs, test circuitry including a plurality of upwardly directed channel nodes below the support means, and some means of connecting the channel nodes to the BUT nodes, the connection means including a universal board carrying probes in a universal grid pattern, means to activate selective probes, and a translator board (also known as a test fixture" to make electrical connections between the upper and lower conductors in different patterns. In many cases, vacuum is used to hold the circuit boards down on the test fixtures as they are being tested. An example of such a configuration is shown in U.S. Pat. No. 4,884,024, entitled: "Test Pin Assembly For Circuit Board Tester", owned by Teradyne, Inc., of Boston, Mass.

As there are many different types of circuit boards which have different types of electrical connections, each circuit board tends to be associated with a different test fixture. Therefore, if more than one circuit board is tested atop a particular test apparatus, it is necessary to place different associated test fixtures atop the test apparatus. If many different circuit boards are tested at a particular facility, that facility may need to store that many (often hundreds) test fixtures, which is often done by using multi-level horizontal surface shelving.

Such test fixtures typically weigh in the range of 50–200 pounds. Furthermore, as there are many different manufacturers of test fixtures as well as different manufacturers of test apparatuses, mechanical automation has been rendered difficult.

The known prior art addresses this situation by utilizing manual labor; a person manually picks up the test fixtures and moves it from one location to another. As the tester is approximately the size of a workbench, and the shelving used can take a variety of configurations, there is a risk of back and other injury to the operator and to the test fixture during such transport.

Therefore it may be seen that there is a need in the art to provide a method and apparatus for suitably manipulating test fixtures of many different sizes and shapes back and forth between shelving and test apparatuses of many different sizes and shapes, which is simple to use, economical to manufacture, effectively and adequately handles relatively expensive test fixtures, and includes safety features.

SUMMARY OF THE INVENTION

The present invention overcomes deficiencies in the prior art by providing a method and apparatus for suitably and safely manipulating test fixtures of many different sizes and shapes back and forth between shelving and test apparatuses of many different sizes and shapes, which is simple to use, economical to manufacture, effectively and adequately handles relatively expensive test fixtures, and includes safety features. The apparatus is adjustable in its "gripping width", includes a "wrist action" to allow adequate inclination of the test fixtures during installation and removal relative to the test apparatus, can be used with universal grip configuration, and includes the use of safety limit switches to discourage human injury and mechanical damage.

Generally described, the present invention provides an apparatus for manipulating a test fixture having two opposing handles between two positions, a first substantially horizontal position at a first elevation to a second inclined position at a second elevation, the apparatus comprising a frame, a lift apparatus supporting the frame and configured to lift and lower the frame along a first, substantially vertical, axis, a pair of shuttle assemblies each configured to move along a track substantially parallel to a second axis substantially perpendicular to the first axis, a pair of elongate arms each having front and rear ends, each rear end attached to a respective shuttle assembly, gripping elements for gripping the test fixture handles, the gripping elements pivotably attached to the forward ends of the arms about an axis substantially parallel to the second axis, and a centering mechanism tending to maintain the arms centered about a vertical plane normal to the second axis, such that the test fixture can be manipulated from the first installed storage position to a second position by engaging the opposing handles with the gripping elements and operating the lift such that movement is caused along the first and second axes.

Therefore it is an object of the present invention to provide a method and apparatus for manipulating test fixtures.

It is a further object of the present invention to provide a method and apparatus for manipulating test fixtures of many different sizes and shapes.

It is a further object of the present invention to provide a method and apparatus for manipulating test fixtures of many different sizes and shapes between shelving and test apparatuses of many different sizes and shapes.

It is a further object of the present invention to provide a method and apparatus for manipulating test fixtures which is simple to use.

It is a further object of the present invention to provide a method and apparatus for manipulating test fixtures which is economical to manufacture.

It is a further object of the present invention to provide a method and apparatus for manipulating test fixtures which includes safety features.

It is a further object of the present invention to provide a method and apparatus for manipulating test fixtures which is adjustable in its "gripping height".

It is a further object of the present invention to provide a method and apparatus for manipulating test fixtures which is adjustable in its "gripping width".

It is a further object of the present invention to provide a method and apparatus for manipulating test fixtures which can be used with universal grip configuration.

It is a further object of the present invention to provide a method and apparatus for manipulating test fixtures which includes the use of safety limit switch to discourage mechanical damage to the lift apparatus, the test apparatus, or test fixture.

Other objects, features, and advantages of the present invention will become apparent upon reading the following detailed description of the preferred embodiment of the invention when taken in conjunction with the drawing and the appended claims.

BRIEF DESCRIPTION OF THE DRAWINGS

FIG. 4 is a top plan view of an isolated end-effector apparatus 20 according to the present invention, with the top of the page being the forward end of the end-effector apparatus 20, and the arrows showing the coordinated side-to-side side movement of the arms upon rotation of the handwheel 40.

FIGS. 5A and 5B are side isolated elevational views of a subassembly of the present invention, illustrating the "tilting"-action provided by the present invention, with FIG. 5A showing a right gripping member 30R gripping a test fixture in a substantially horizontal position, and FIG. 5B showing the gripper 30R gripping a test fixture 11 when in an inclined position.

FIGS. 6, 7, and 8 are related views of the forward portion of the left support arm 26L and a left crank arm 58L along with a left bell crank 28L, which supports a left gripping member 30L. FIG. 6 is a top plan view (with the forward end of the support arm to the viewer's right), FIG. 7 is a right side elevational view, and FIG. 8 is a front elevational view, with a left side bracket shown in FIG. 8 in phantom.

FIGS. 16 and 17 are related views of a right shuttle assembly 22R, with FIG. 16 being a rear elevational view and FIG. 17 being a right side elevational view.

FIGS. 18 and 19 are related rear elevational and right side elevational views, respectively, of a left portion of the end-effector, including the left end plate 24L, upper frame rail 32, lower frame rail 34, spline shaft 52 (contained by use of flat sliding bearing plates fixed to the end of the shaft), and the threaded rod 42. The end of the double-threaded rod 42 is rotatably mounted relative to the left end plate.

DETAILED DESCRIPTION OF THE PREFERRED EMBODIMENT

Outline

General, Including Environment

The Handles

The Frame

The Arms and Their Width Adjustment

Wrist Angle Adjustment

The Pivoting Mount

Safety Limit Switches

Adjustments

Materials

Methods of Use

Advantages

Alternatives

Conclusion

General Construction and Operation, Including Environment

As noted above, the apparatus according to the present invention is configured for suitably manipulating test fixtures of many different sizes and shapes back and forth between shelving and test apparatuses of many different sizes and shapes. It is simple to use, economical to manufacture, effectively and adequately handles relatively expensive test fixtures, and includes safety features. The apparatus is adjustable in its "gripping width", includes a "wrist action" to allow adequate inclination of the test fixtures during installation and removal relative to the test apparatus, can be used with universal grip configuration, and includes the use of safety limit switches to discourage human injury and mechanical damage to the testor or test fixture.

Figure 1:
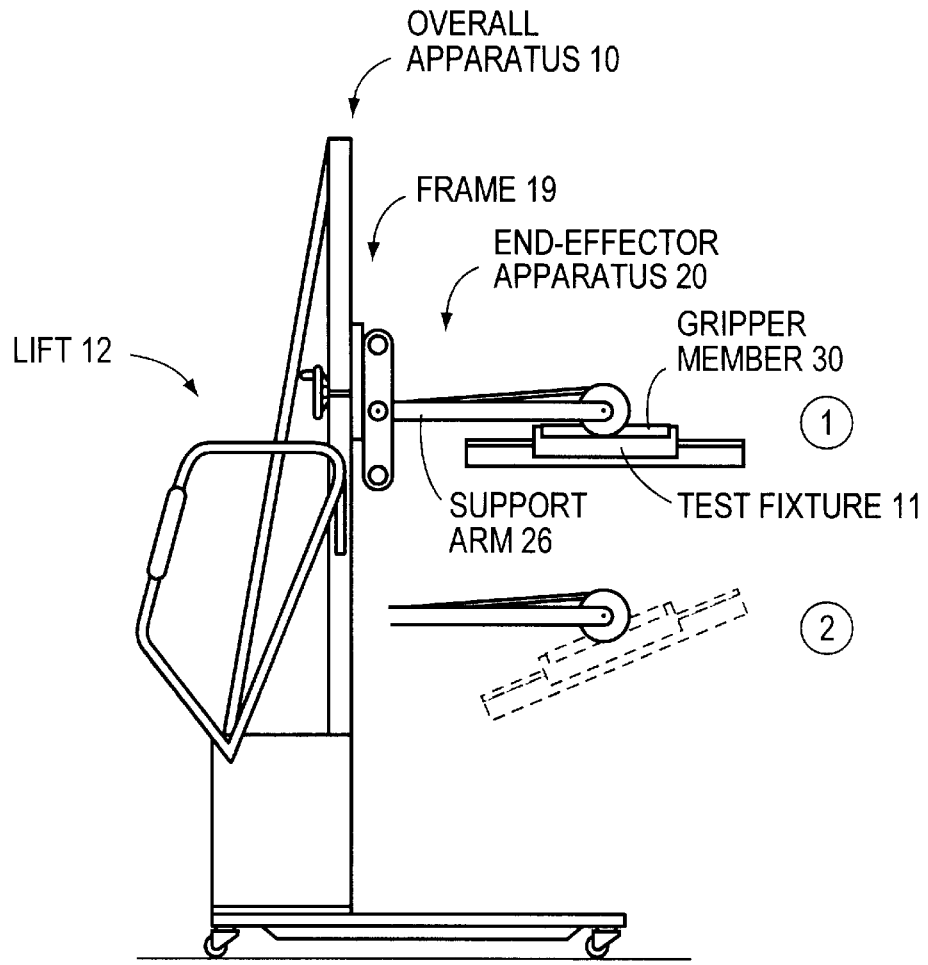
FIG. 1 is a right side view of the end-effector apparatus 20 (a.k.a an end-effector "assembly" 20) according to the present invention, with the forward portion of the machine to the viewer's right. Position "1" is higher than position "2", and position "2" shows an inclined fixture orientation.
Figure 2:
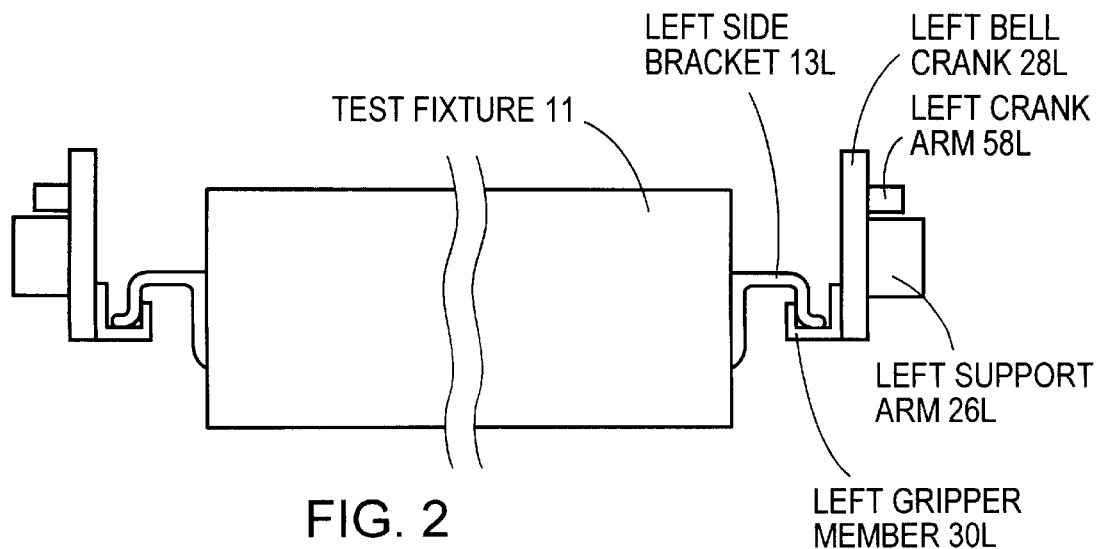
FIG. 2 is a front elevational view of a test fixture 11 having two side brackets 13 mounted thereon and supported by two gripping members 30.

As shown in FIG. 1, the overall apparatus 10 (which includes the end-effector apparatus 20 and a prior art lift apparatus 12 such as known in the art), is configured to lift a test fixture 11, and move it from one location to another.

As noted above, the end-effector apparatus 20 is used in conjunction with a conventional lift 12, which is generally in the form of a upright hand truck, except that it is not generally designed to tilt from its upright position, and includes an electrically-operated lead screw which is configured to threadably engaged relative to a slidably mounted mounting flange including a vertically-oriented forwardly-facing mounting plate. Such lifts are known in the art as those made by Alum-A-Lift, Inc., 7907 Bankhead Highway, Winston, Ga. 30187.

Generally described, the end-effector apparatus 20 includes a frame 19 which is pivotably mounted within a controlled pivoting range relative to the conventional lift 12, such that the end-effector assembly 20 can be raised and lowered by the conventional lift 12. Two parallel horizontal support arms 26 extend generally forwardly from the frame 19 of the end-effector assembly 20, and each includes a corresponding gripper member 30. The two gripper members not only include the "wrist" tilting-type action, but are also configured to be able to be moved closer together or further apart (while remaining equally spaced from a central location, or "centered") in order to grasp mounting brackets 13 which act as handles and are attached to test fixtures 11 as discussed elsewhere in this application.

By manipulating a pair of handwheels and operating the vertical raise-and-lower feature conventional lift 12, the two gripper members 30 can be used to come together to grip the brackets 13 attached to the test fixtures 11, lift and lower the test fixtures 11 and pivot the test fixtures 11 about a horizontal axis, such that the test fixtures can be moved between a variety of positions atop testing consoles and storage shelving. One handwheel adjusts the spacing of the handles, and the other handwheel adjusts the "wrist action" as described in further detail below. The up and down action is supplied by controlling the lift 12.

The Mounting Brackets (a.k.a. "Handles")

As noted above, there are many different manufacturers of test fixtures, and to date there is no ANSI or other standard to standardize the dimensions of such test fixtures. Therefore, many different widths and side surface shapes of test fixtures are encountered.

In order to accommodate such variations, fixture handle configurations have been developed for use with the present invention. In one embodiment, these gripping handles are aluminum, and are configured to be mounted on the opposing left and right sides of the test fixtures 11.

If desired, some cutouts in the gripping members may be provided to accept the wire handles made by Hewlett Packard. The handles also may vary slightly to accommodate different fixture side face configurations.

As may be understood the shapes of the gripping handles can now allow for easy use by human hands, without the use of the overall apparatus 10.

The Frame

Figure 3:
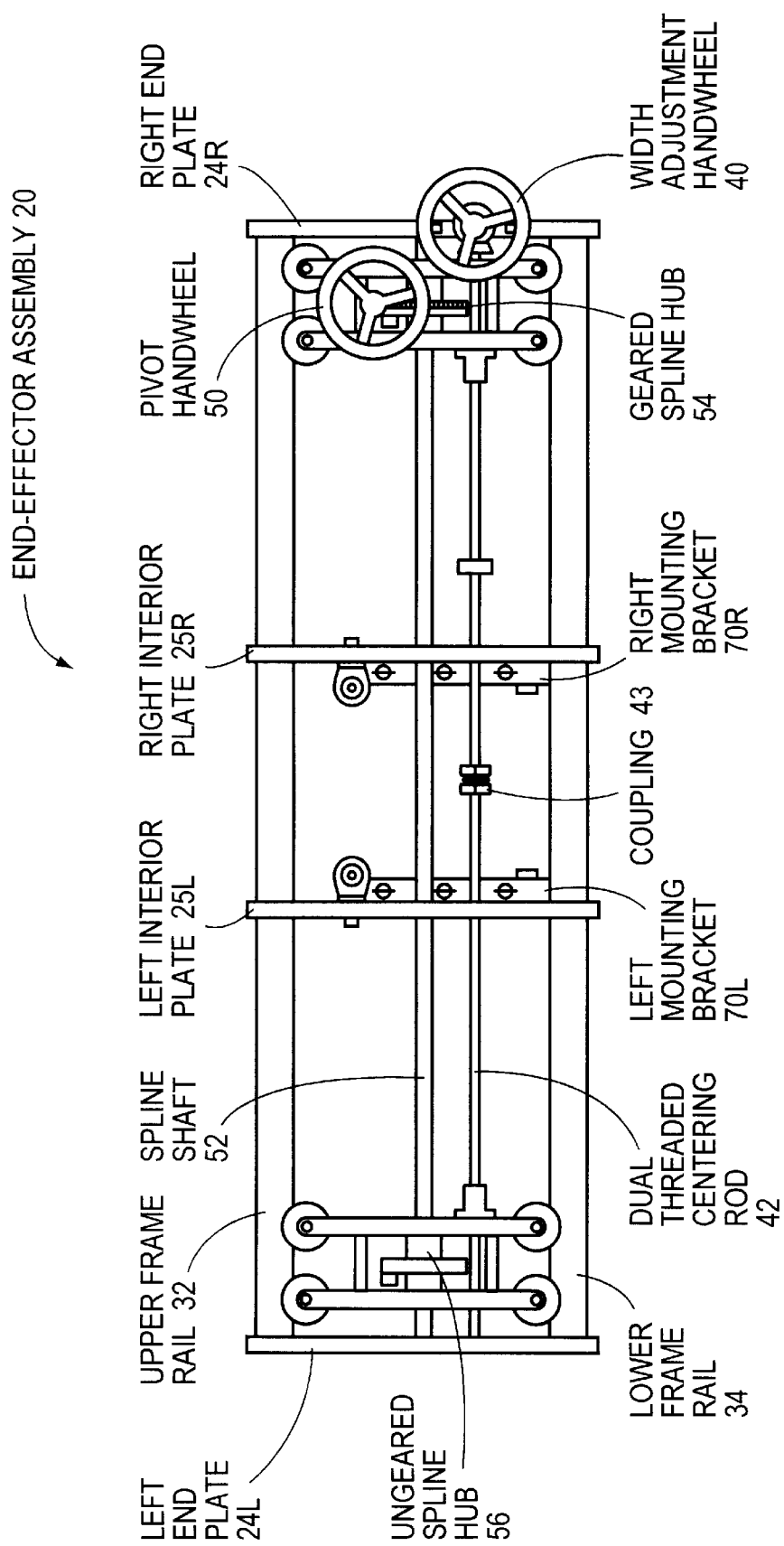
FIG. 3 is a rear ("operator's") view of an isolated end-effector apparatus 20 according to the present invention.

Referring now also to FIG. 3, the frame 19 of the end-effector apparatus 20 is pivotably mounted relative to the conventional lift apparatus 12, and includes members relatively rigidly mounted relative to each other. These elements include an upper frame rail 32, a lower frame rail 34, and four plate members, left and right interior plate members 25L, 25R, and left and right end plate member 24L, 24R.

The four substantially similar plates 24L, 24R, 25L, 25R, are used to attach the two frame rails 32, 34 together.

The Arms and Their Width Adjustment

Reference is now also made to FIG. 4. As noted above, the support arms 26 are adjustable in width relative to the frame 19 of the end-effector 20. This adjustability is provided by a handwheel 40 which can be manipulated as desired by the operator to cause the arms to be moved inwardly or outwardly as desired.

As shown in FIGS. 14–17, this is made possible by the use of a pair of rolling shuttle assemblies 22R, 22L, each of which roll upon a "track" defined by the upper and lower frame rails 32, 34. These right and left rolling shuttle assemblies 22R, 22L support the rear ends of the right and left support arms 26R, 26L, and allow the arms to translate side-to-side along a substantially horizontal path. The right and left arms do not pivot relative to rolling assemblies; instead the entire frame 19 of the end-effector pivots as discussed elsewhere in this application. Two gripping members 30L, 30R are attached to the forward ends of the right and left support arms 26L, 26R.

Generally described, each of the left and right shuttle assembles 22L, 22R includes a frame to which four associated rollers 21 are rotatably attached. The frame includes two horizontally oriented frame members 23H, (one an "upper" and one a "lower" frame member) and two vertically oriented frame members 23V (one an "inside" and one an "outside" frame member). The rear end of a respective support arm is attached to this frame. In the embodiment shown, the left and right support arms 26L, 26R are attached to the inside surface of the outside vertical frame members of the rolling shuttle assemblies 22L, 22R.

Figures 14, 15:
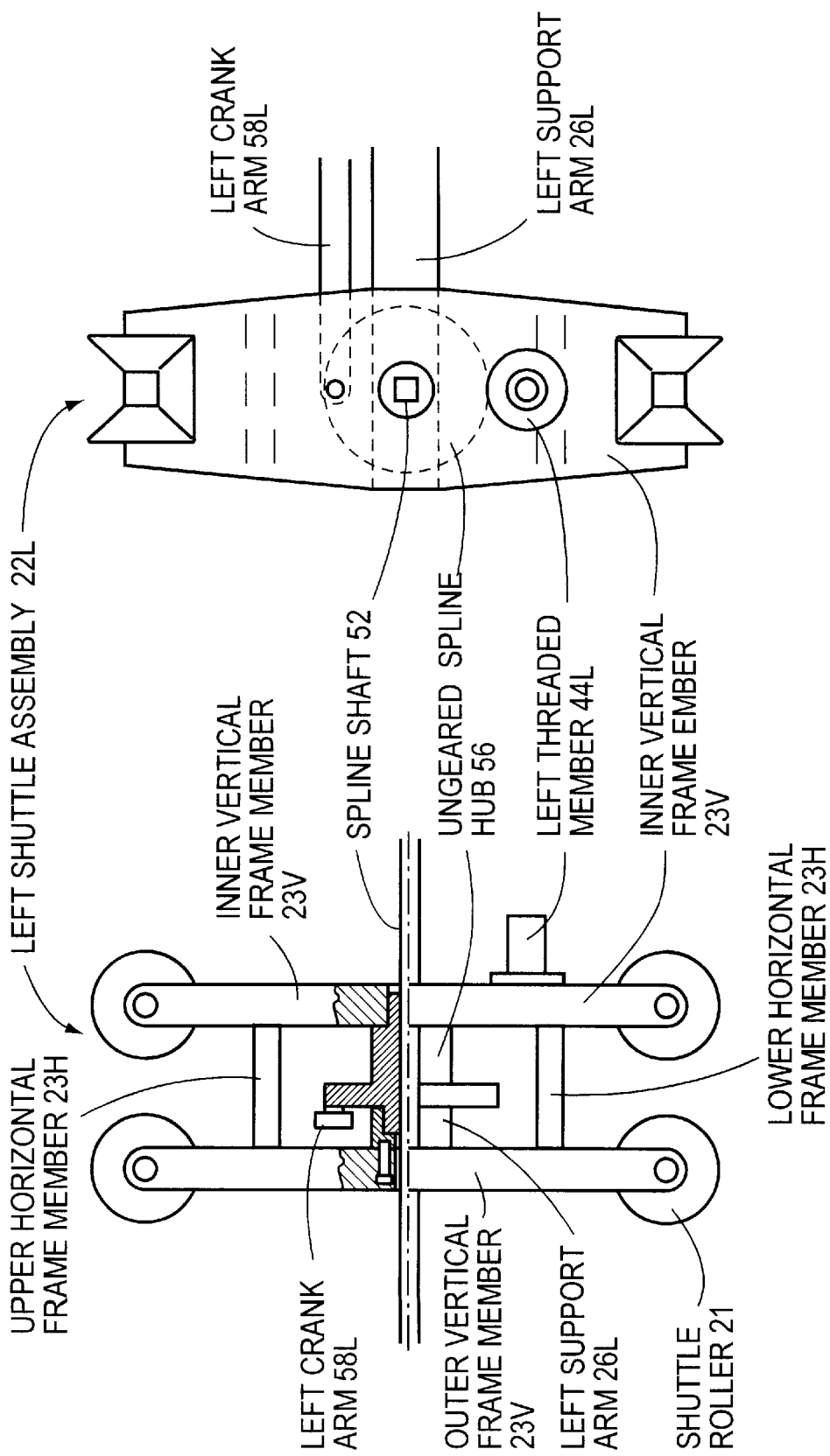
FIGS. 14 and 15 are related views of a left shuttle assembly 22L, with FIG. 14 being a rear elevational view and FIG. 15 being a right side elevational view.
Figure 20:
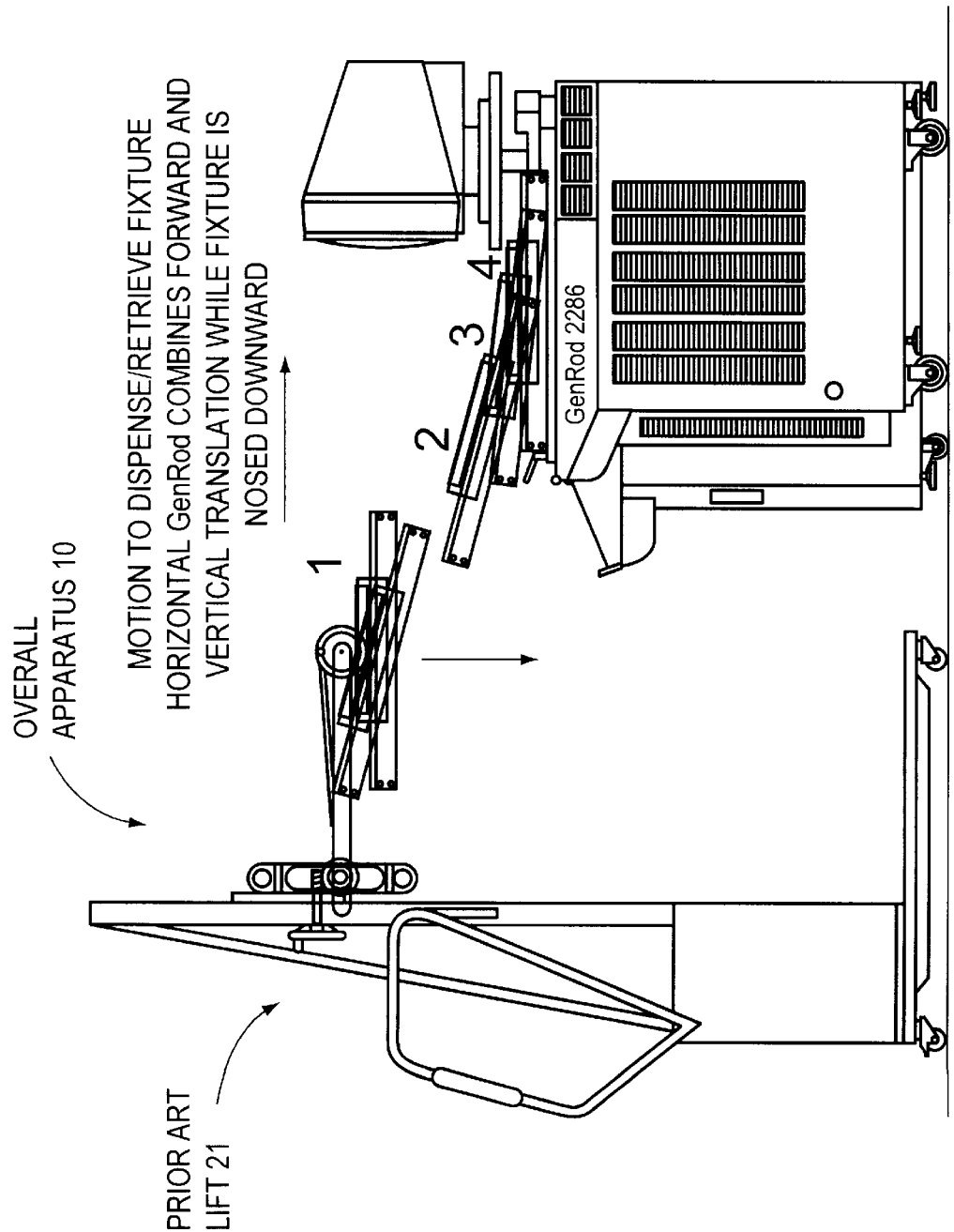
FIG. 20 is an illustration of the motion to dispense/retrieve a fixture on a horizontal "GenRad" test machine. This combines forward and vertical translation while the fixture is nosed downward.
Figure 21:
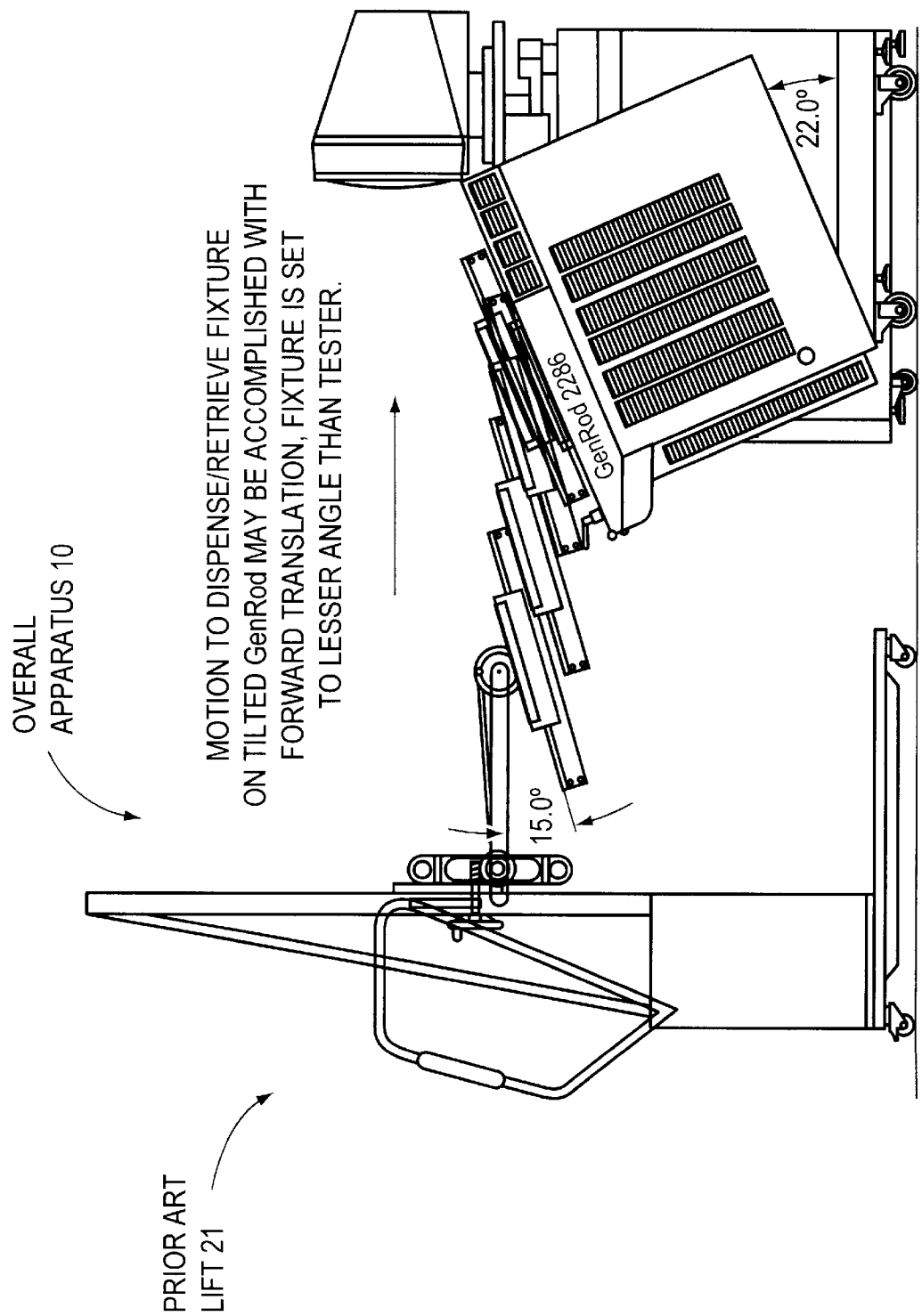
FIG. 21 illustrates the motion to dispense/retrieve a fixture on a tilted GenRad machine. This may be accomplished with forward translation. In this configuration, the fixture is set to a lesser angle than the tester.

In order to cause the rolling shuttle assemblies 22L, 22R to move apart or together, a dual threaded centering rod 42 is used (see FIG. 3), which includes two oppositely threaded rod sections coupled by a flexible coupling 43. The dual threaded centering rod 42 is threadably engaged to each of the left and right rolling shuttle assemblies 22L, 22 by means of left and right threaded members 44L, 44R, which are fixed to the respective shuttle assemblies as shown in FIGS. 14 and 16.

The threaded centering rod 42 is threaded in two directions, and, upon rotation, causes the arms to move inwardly and outwardly such that they are spaced equally from a center location. A flexible coupling 43 is provided intermediate the two threaded rod sections in order to take out misalignment.

Wrist Angle Adjustment

Figure 9:
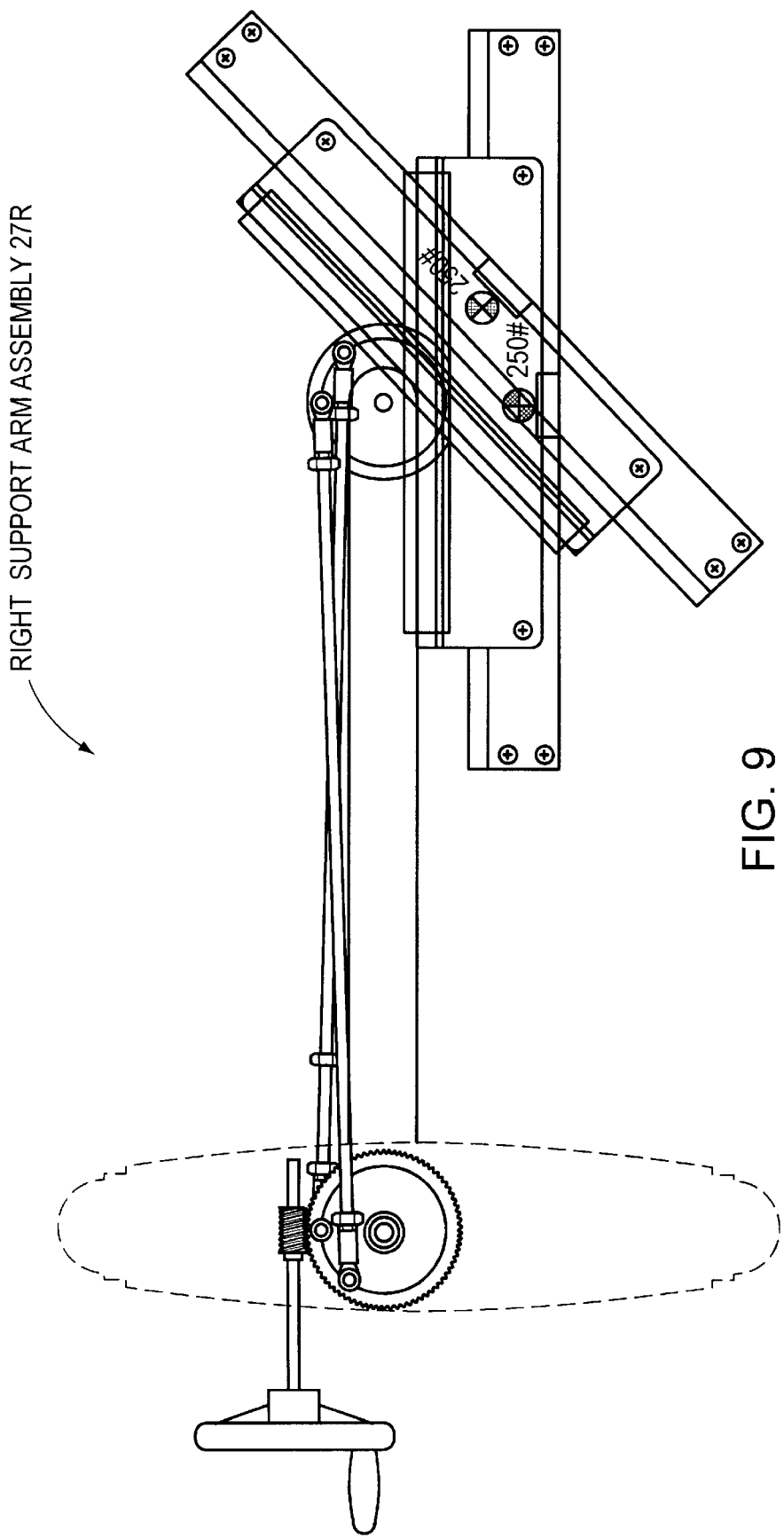
FIG. 9 is a right side "computer-model"-type elevational view of a right support arm assembly 27R, which includes a right shuttle assembly 22R, a right support arm 26R, and a right gripper member 30R, among other elements.
Figure 11:
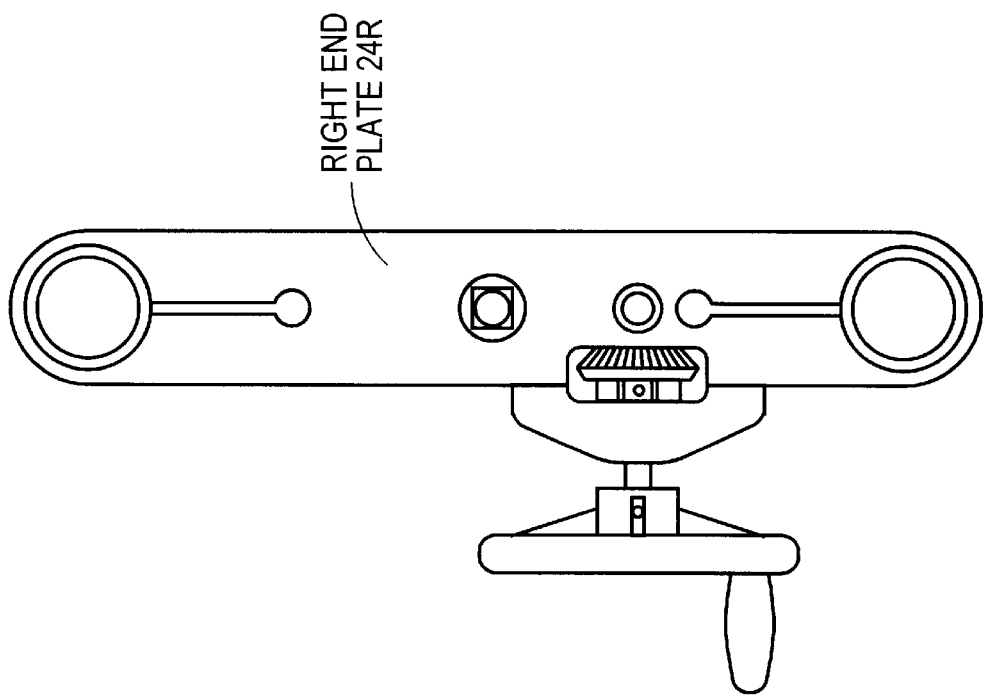
FIG. 11 is a right side elevational view of that shown in FIG. 10.
Figure 10:
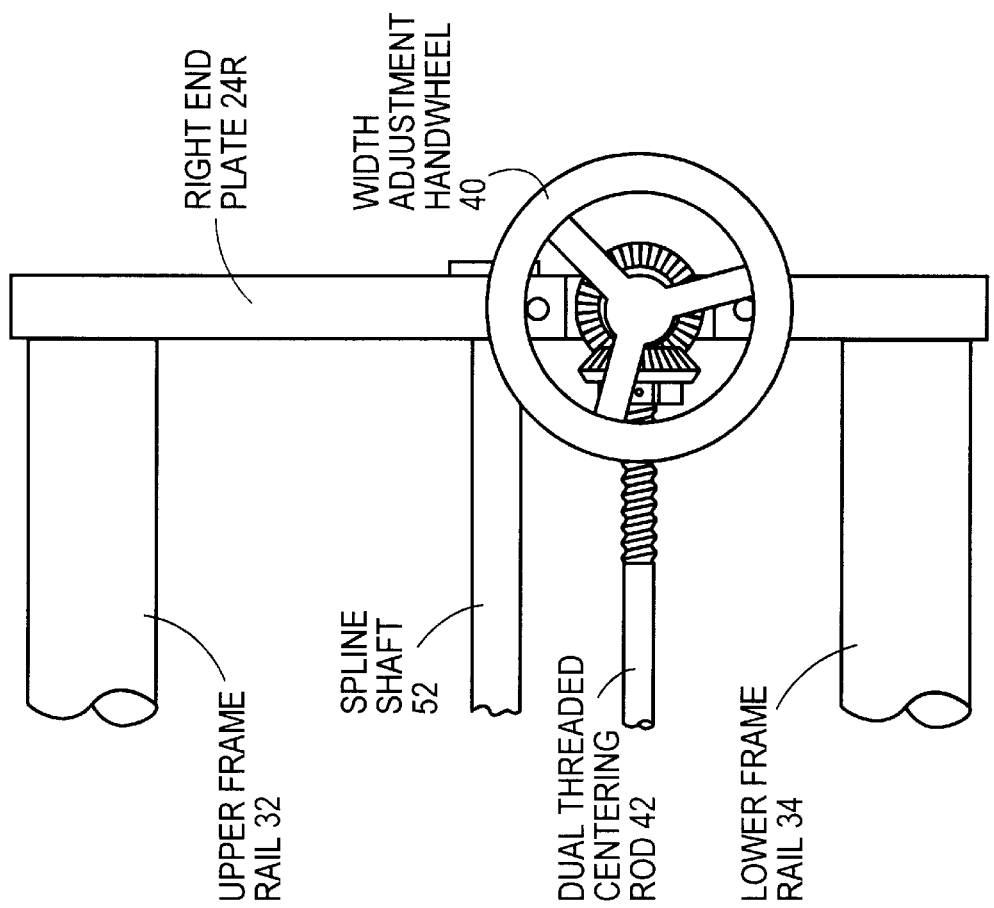
FIG. 10 is a rear elevational view of a right side portion of the end-effector apparatus 20 according to the present invention. This right side section includes a right end plate 24R, and a width adjustment hand wheel 40. This hand wheel 40 is rotatably mounted relative to the end plate, and includes a beveled gear on its forward end. This beveled gear meshes with a similar bevel gear mounted to the right end of the dual threaded centering rod 42.
Figure 13:
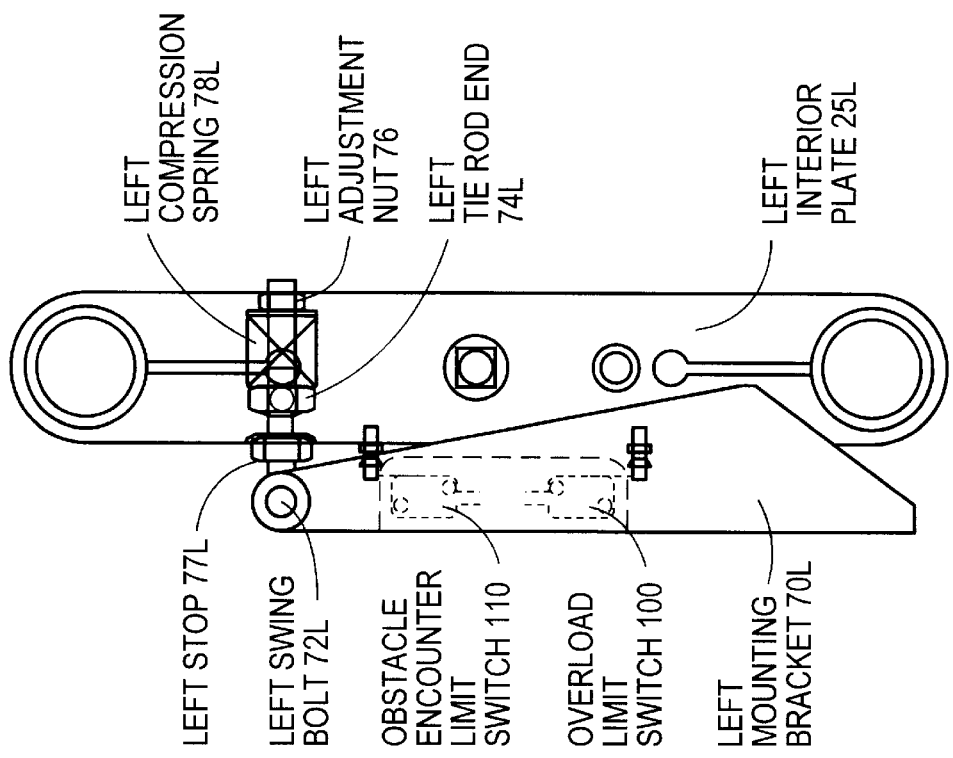
FIG. 13 is a right side view of that shown in FIG. 12.
Figure 12:
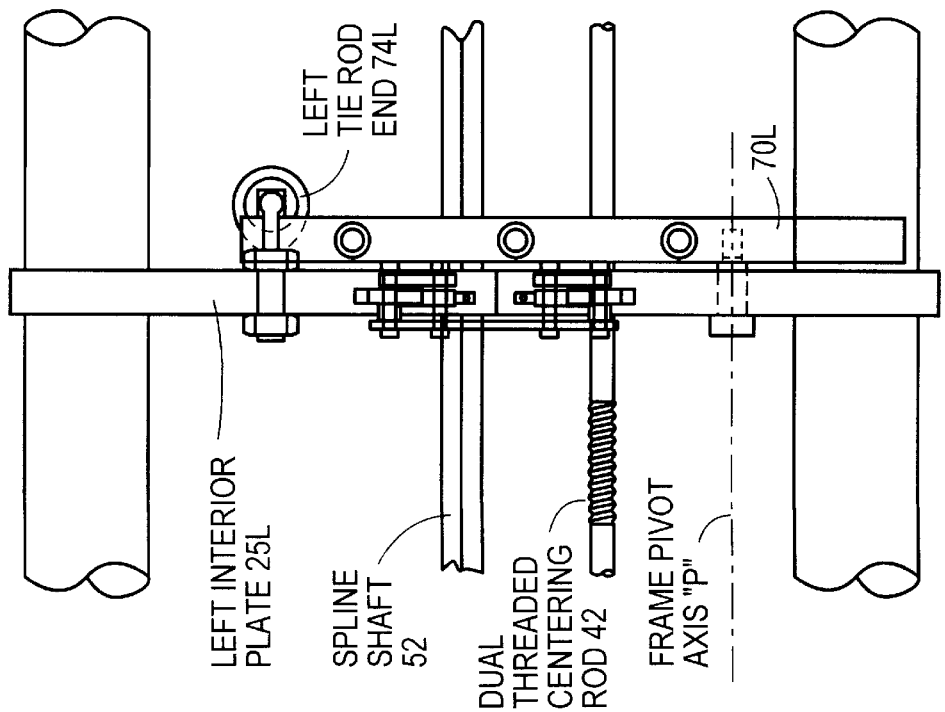
FIG. 12 is a "computer-type" rear elevational view of an interior plate 25 of the end-effector assembly 20, illustrating the pivoting relationship between the interior plate 25, and an associated mounting bracket 70. Limit switches 100, 110 are mounted to the stationary mounting bracket 70, and the relative movements between the mounting bracket 70 and the interior plate, trigger the respective switches 100, 110.

As noted above, the end-effector assembly 20 according to the present invention includes a "wrist action" feature, which allows the end-effector assembly 20 to grip a test fixture 11 and pivot it about a horizontal axis substantially perpendicular to the longitudinal axis of the left and right support arms 26L, 26R. This action is shown in reference to FIGS. 5A and 5B, and FIG. 9.

FIGS. 5A and 5B are side isolated elevational views of a subassembly of the present invention, illustrating the "tilting"-action provided by the present invention, with FIG. 5A showing the grippers gripping a test fixture in a substantially horizontal position, and FIG. 5B showing the grippers gripping a test fixture when in an inclined position.

Each of the left and right gripping members 30L, 30R are substantially rigidly attached to a corresponding left and right bell cranks 28L, 28R. These left and right bell cranks 28L, 28R are pivotably attached via a pivoting connection to the forward ends of the corresponding left and right support arms 26L, 26R.

The pivoting action is provided by turning the pivot angle adjustment handwheel 50, which is directed generally rearwardly toward the operators normal operating position. By rotting the pivot angle adjustment handwheel 50 in one direction, the gripping members 30L, 30R, can be moved from a position as shown in FIG. 5A to that of FIG. 5B. Conversely, by rotating the pivot angle adjustment handwheel 50 in the opposite direction, the gripping members 30L, 30R can be moved from a position as shown in FIG. 5B to that of FIG. 5A.

Reference is now also made to FIG. 17, which is a side elevational view of a portion of the right shuttle assembly 22R according to the present invention.

A pivot angle adjustment handwheel 50 is rotatably mounted relative to the frame of the right shuttle assembly 22R. This pivot angle adjustment handwheel 50 is attached to an elongate worm gear 51, which is rotated as the pivot angle adjustment handwheel 50 is rotated. The worm gear 51 is configured to engage and drive a geared splined hub 54 which is likewise rotatably mounted relative to the right shuttle assembly 22R. As discussed in detail elsewhere, a non-circular spline shaft 52 slidably extends through a correspondingly non-circular hole in the hub of the geared spline hub 54.

As shown in FIGS. 5A–5B, the rear end of a right crank arm 58R is pivotably attached to the geared spline hub 54. The front end of the right crank arm 58R is pivotably attached to the right bell crank 28R, which as noted above is pivotably attached to the front end of the right support arm 26R. As the right bell crank 28R is also rigidly attached relative to the right gripper member 30R, it may be understood that rotation of the pivot angle adjustment handwheel 50 causes the worm gear 51 to rotate about its horizontal, longitudinal axis. Such movement causes the geared spline hub 54 to rotate right crank arm 58R to move either forwardly or rearwardly, causing the right bell crank 28R to likewise rotate in the same general direction as the geared spline hub 54. As the bell crank pivots about such an axis, so does its associated gripper member pivot about such an axis. This may be understood as a "wrist"-type action, which is an important of the invention as discussed elsewhere in this application.

The above description only describes the "wristlike" movement of the right gripper member 30R. However, the left gripper member 30L moves in tandem with the right gripper member such that they can work together to grip and pivot a test fixture 11. This tandem movement is facilitated by the use of a noncircular spline shaft 52 as described below.

Now also referencing FIGS. 3, 14, and 15, the noncircular spline shaft 52 (square in transverse cross section in the embodiment shown) is rotatably mounted relative to the frame 19 of the end-effector apparatus 20. Such a mounting is provided by use of bearings, in the end plates, but is also provided by two splined hub members 54, 56 as described below.

The spline hubs 54, 56 include the previously discussed geared spline hub 54, as well as an ungeared splined hub 56. The geared spline hub 54 is part of the right rolling shuttle assembly 22R; the ungeared splined hub 56 is part of the left rolling shuttle assembly 22L. The geared spline hub 54 includes a peripheral bronze metal gear pressed to a plastic hub portion; the ungeared splined hub 56 is similar except that no peripheral metal gear is included.

Each of the spline hubs 54, 56 includes a noncircular bore which slidably accepts the transverse cross section of the spline shaft 52. Each of the spline hubs 54, 56, are also rotatably mounted relative to their respective roller assemblies about an axis lying substantially along the central longitudinal axis of the spline shaft 52.

The spline shaft 52 passes through the holes in the spline hubs 54, 56, and the spline hubs 54, 56 are rotatably captured within the frames of the shuttle assemblies 22L, 22R. This allows the spline hubs 54, 56 to rotate with the spline shaft relative to the frames of the shuttles, while if necessary allowing the spline hubs to slide along a length of the spline shaft 52. This occurs as noted above when the handwheel 40 is turned to separate or draw together the load support arms 26L, 26R.

Therefore it may be seen that as the splined hub 54 is rotated within its shuttle assembly as noted above, torque is transferred through the spline shaft 52 to the ungeared splined hub 56.

The ungeared splined hub 56 is mechanically attached relative to the left gripper member 30L in a manner similar to the attachment between the geared splined hub 54 and the right gripper member 30R. A left crank arm 58L has its rear end pivotably attached to the ungeared splined hub 56. The front end of the left crank arm 58L is pivotably attached to the left bell crank 28L, which as noted above is pivotably attached to the front end of the left support arm 26L.

The worm gear 51 (see FIG. 17) discussed above is rotatably mounted about its longitudinal axis within a nylon frame member, which is the upper horizontal frame member of the right shuttle assembly. As the left shuttle assembly does not include a worm gear, no bearing surface is needed and thus metal is used instead of plastic for the upper horizontal shuttle frame member.

As noted above, square holes are broached through allowing the square spline shaft to slide relative the spline hubs but not to rotate relative thereto pass through. Although the shaft is shown as being square, it could be round and keyed, hex-shaped, or other noncircular shapes as desired.

This "wrist action" provides a pivoting range of the gripping members 30L, 30R from substantially horizontal (0 degrees) to approximately 45 degrees, with much use being made at the 22.5–30 degree range. Stop members can also be provided to interfere with the link arms to control the range of the wrist action. These stop members can be adjustable if desired.

The Pivoting Mount

As noted above, the frame 19 of the end-effector apparatus 20 is pivotably mounted relative to the front of a prior art lift mechanism 21, by use of pair of mounting brackets 70, and pivoting-type hardware.

The mounting brackets 70 are attached to a substantially vertical mounting surface provided by the lift apparatus 21. This mounting surface in one preferred embodiment is defined by a block member which is captured along a substantially vertical track and is moved up and down upon rotation of a lead screw in a configuration manufactured by Alum-A-Lift, Inc., Wintson, Ga.

The pivoting axis of the frame 19 of the end-effector apparatus 20 assembly relative to the mounting plate is substantially horizontal, and side-to-side in orientation. A pair of pivoting hardware assemblies are provided intermediate the mounting brackets 70 and the fram 19; however for discussion purposes one will be described.

Each of the pivoting hardware assemblies includes a tie rod end 74, a swing bolt 72, a stop 77, and a compression spring 78. The tie rod end extends sidewardly and towards the center of the frame 19, extending inwardly from one of the interior frame members. The tie rod end includes a spherical bearing having a bore having a generally horizontal axis oriented front-to-back. This bore slidably accepts a middle portion of the length of a swing bolt 72. The swing bolt 72, while having a longitudinal axis extending generally front-to-back, has its rearward end pivotably attached to the mounting bracket 70 along a substantially horizontal pivoting axis which is oriented side-to-side. This pivoting movement is provided by use of a shoulder bolt.

At the forward end of the swing bolt is threadably mounted an adjustable nut 76, which can be rotated to move along the front length of the swing bolt 72. A compression spring 78 is positioned on the swing bolt between the nut and the spherical bearing (or "eye") of the tie rod end 74.

As weight is placed upon the arms, the compression springs are compressed, and the eyes of the tie rod ends slide along the lengths of the swing bolts. If weight is removed from the arms, the compression springs are less compressed. If no load is placed upon the arms, the two springs are compressed, but only by the weight of the arms, the frame, the shuttle assemblies, and their associated hardware.

If a force is applied upwardly on the ends of the arms, the frame will pivot such that a obstacle encounter safety switch as discussed elsewhere in this discussion will be triggered. A stop 77 may also be engaged.

Safety Limit Switches

There are two limit switches that are used on the end-effector, an end-effector overload limit switch 100 and an obstacle encounter limit switch 110.

The end-effector obstacle encounter limit switch 100 is generally tripped when the end-effector assembly 20 is overloaded. This can happen if too much dead weight is placed upon the end-effector assembly 20, or if the end-effector assembly 20 is overloaded if it encounters an obstacle upon lifting. This can include the situation when an operator forgets to disengage a mechanical connection between a fixture and a test assembly. It should be understood that this switch is tripped after the compression springs are compressed past their preselected range.

The end-effector obstacle encounter limit switch 110 is generally tripped when the end-effector assembly 20 is being lowered by the lift 12, and an object is encountered which causes the end-effector to pivot upwardly relative to the mounting brackets 70.

The end-effector overload limit switch 100 is wired normally open. It is wired in series with the lift's up limit switches. Under no-load or normal load conditions, this switch is made (tripped closed) completing the lift's up circuit. However, additional load beyond its set point will cause the trip to move away from the limit switch, re-opening the lift's up circuit inhibiting further upward travel.

The obstacle encounter limit switch 110 is wired normally closed. It is wired in series with the lift's down limit switches. If the end-effector contacts an obstacle during downward travel, this limit switch will trip, thus opening the lift's down circuit inhibiting further downward travel. Its sensitivity typically does not have to be adjusted. A finger-like trigger may extend from the frame 19 to trigger each of the limit switches described above. These triggers may be bendable or adjustable to provide greater or lesser degrees of sensitivity to pivoting as desired.

Adjustments

Various adjustments may be made to the apparatuses according to the present invention. These include adjustments to the maximum width of the arms (by adjusting the collar on the dual threaded rod), adjustment of the preload on the compression springs shaft, adjustments of the switch triggers, etc.

Materials

Various plastic elements are used for sliding bearing purposes. These includes the upper horizontal frame member of the right shuttle assembly, as well as the geared spline hub 54 and ungeared spline hub 56.

Delrin bearing material made by DuPont may able used, although other bearing materials may also be used without departing from the spirit and scope of the present invention.

Methods of Use

To use the apparatus 10, and operator can push it towards a storage shelf, lift and open it to the right width get it at the right angle, pull the gripper members together, lift to engage and lift the side shelf members, and move the fixture to the desired location. To release the fixture, the arms can be lowered to disengage the gripping members from the handles, and then the arms can be withdrawn rearwardly or outwardly.

Advantages

The apparatus accommodates Genrad, hewlett Packard, Teradyne, and a variety of different equipment designs from different manufacturers.

Alternatives

It should be understood that other alternative designs may be provided without departing from the spirit and scope of the present invention. This includes the use of less than 8 rollers, smaller frame rails, the use of linear slide bearings, or a different spline shape instead of the square configuration shown.

Conclusion

While this invention has been described in specific detail with reference to the disclosed embodiments, it will be understood that many variations and modifications may be effected within the spirit and scope of the invention as described in the appended claims.

What is claimed is:

1. An apparatus for manipulating a test fixture having two opposing handles between two test fixture positions, a first substantially horizontal position at a first elevation and a second inclined position at a second elevation, said apparatus comprising:

a frame;

a lift apparatus supporting said frame and configured to lift and lower said frame along a first, substantially vertical, axis, with said frame being pivotably attached relative to said lift apparatus along a frame pivoting axis;

a pair of shuttle assemblies each operably associated with said frame and each configured to move along a track substantially parallel to a second axis substantially perpendicular to said first axis;

a pair of elongate arms each having front and rear ends, each said rear end attached to a respective shuttle assembly;

gripping elements for gripping said test fixture handles, said gripping elements pivotably attached to said front ends of said arms about an axis substantially parallel to said second axis;

a centering mechanism tending to maintain said arms centered about a vertical plane normal to said second axis;

a compression spring intermediate said frame and said lift apparatus, said spring configured to relatively deform and provide a counteracting force when additional force applied downwardly on said gripping elements causes said pivoting about said frame pivoting axis;

a swing bolt pivotably attached to one of said frame and said lift apparatus and including an elongate shaft portion;

an eyelet attached to the other of said frame and said lift apparatus and defining a bore slidably accepting said elongate shaft portion such that as said frame pivots relative to said lift apparatus, said eyelet slides along said elongate shaft portion of said swing bolt;

a stop member attached at a location along said shaft portion and configured to stop said sliding motion of said eyelet in one sliding direction; and a retaining nut at a second location along said shaft portion, wherein said compression spring is intermediate said retaining nut and said eyelet, and said compression spring tends to be additionally compressed due to additional loading of said gripping elements, and wherein said frame is pivotably attached relative to said lift apparatus within a predetermined range along said frame pivoting axis, being substantially parallel to said second axis, such that said test fixture can be manipulated from said first horizontal position to said second inclined position by engaging said opposing handles with said gripping elements and operating said apparatus such that movement is caused along said first and second axes.

2. The apparatus as claimed in claim 1, wherein said swing bolt includes a threaded portion and wherein said retaining nut can be adjusted along a length of said threaded portion such that said compression spring can be variably preloaded.

3. The apparatus as claimed in claim 1, further comprising an lower alarm for indicating when excessive load is placed atop said gripping elements.

4. The apparatus as claimed in claim 3, further comprising an upper alarm for indicating when said gripping elements encounter an obstacle on the way down.

5. The apparatus as claimed in claim 3, wherein said swing bolt includes a threaded portion and wherein said retaining nut can be adjusted along a length of said threaded portion such that said compression spring can be variably preloaded.

6. The apparatus as claimed in claim 1, further comprising an upper alarm for indicating when said gripping elements encounter an obstacle on the way down.

7. An apparatus for manipulating a test fixture having two opposing handles between two positions, a first substantially horizontal position at a first elevation to a second inclined position at a second elevation, said apparatus comprising:

a frame;

a lift apparatus supporting said fram and configured to lift and lower said frame along a first, substantially vertical, axis;

a pair of elongate arms extending forwardly of said frame;

gripping members for gripping said test fixture handles, said gripping members attached to said forward ends of said arms;

pivoting connection means intermediate said frame and said lift apparatus for pivotably attaching said lift apparatus to said frame within a predetermined range along a frame pivoting axis; and at least one spring intermediate said frame and said lift apparatus, said spring configured to relatively deform and provide a counteracting force when additional force is applied downwardly on said gripping members causing said pivoting about said frame pivoting axis;

a swing bolt pivotably attached to one of said frame and said lift apparatus and including an elongate shaft portion;

an eyelet attached to the other of said frame and said lift apparatus and defining a bore slidably accepting said elongate shaft portion such that as said frame pivots relative to said lift, said eyelet slides along said elongate shaft portion of said swing bolt;

a stop member attached at a location along said shaft portion and configured to stop said sliding motion of said eyelet in one sliding direction; and a retaining nut at a second location along said shaft portion, wherein said spring is a compression spring intermediate said retaining nut and said eyelet, and said compression spring tends to be additionally compressed due to additional loading of said gripping members.

8. The apparatus as claimed in claim 7, further comprising an lower alarm for indicating when excessive load is placed atop said gripping members.

9. The apparatus as claimed in claim 8, further comprising an upper alarm for indicating when said gripping members encounter an obstacle on the way down.

10. The apparatus as claimed in claim 7, further comprising an upper alarm for indicating when said gripping members encounter an obstacle on the way down.

* * * * *